(12) United States Patent
Kim et al.

(10) Patent No.: US 7,635,194 B2
(45) Date of Patent: Dec. 22, 2009

(54) BACKLIGHT ASSEMBLY AND DISPLAY APPARATUS HAVING THE SAME

(75) Inventors: Gi-Cherl Kim, Yongin-si (KR); Ju-Young Yoon, Seoul (KR); Seok-Won Kang, Kwangju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 161 days.

(21) Appl. No.: 11/853,723

(22) Filed: Sep. 11, 2007

(65) Prior Publication Data

US 2008/0062714 A1   Mar. 13, 2008

(30) Foreign Application Priority Data

Sep. 12, 2006   (KR) ................. 10-2006-0087823

(51) Int. Cl.
*G02F 1/13357*   (2006.01)
(52) U.S. Cl. .............. 362/97.3; 362/97.1; 362/561
(58) Field of Classification Search ............. 382/555, 382/560, 561; 362/97.1, 97.2, 97.3
See application file for complete search history.

(56) References Cited

U.S. PATENT DOCUMENTS

| | | | |
|---|---|---|---|
| 6,692,137 B2* | 2/2004 | Blanchard | 362/560 |
| 2003/0227774 A1* | 12/2003 | Martin et al. | 362/240 |
| 2004/0218388 A1* | 11/2004 | Suzuki | 362/561 |
| 2005/0276069 A1* | 12/2005 | Taniguchi et al. | 362/600 |
| 2006/0139945 A1* | 6/2006 | Negley et al. | 362/600 |
| 2007/0159849 A1 | 7/2007 | Sakai | |

FOREIGN PATENT DOCUMENTS

| | | |
|---|---|---|
| EP | 1371901 A2 | 12/2003 |
| JP | 2005-327682 | 11/2005 |
| JP | 2006-228710 | 8/2006 |

OTHER PUBLICATIONS

European Search Report, Application No. 07017717, Dec. 20, 2007, 6 pp.

* cited by examiner

*Primary Examiner*—David V Bruce
(74) *Attorney, Agent, or Firm*—Innovation Counsel LLP

(57) ABSTRACT

A backlight assembly includes a light source unit, a reflective element, a receiving container and a diffusion plate. The light source unit has at least one point light source, and the point light source emits light toward a side surface direction. The reflective element has a reflective surface, and the reflective surface is separated from the point light source toward the side surface direction by a predetermined distance for reflecting the light from the point light source toward an upper direction. The receiving container has a bottom plate and a side wall, for receiving the light source unit and the reflective element. A diffusion plate is disposed over the light source unit and the reflective element. Thus, uniform brightness may be enhanced, and the thickness of a display apparatus may be reduced.

21 Claims, 8 Drawing Sheets

BACKLIGHT ASSEMBLY AND DISPLAY APPARATUS HAVING THE SAME

This application claims priority to Korean Patent Application No. 10-2006-0087823 filed on Sep. 12, 2006 and all the benefits accruing therefrom under 35 USC § 119, the contents of which in its entirety are herein incorporated by reference.

BACKGROUND OF THE INVENTION

1. Field of the Invention

The present invention relates to a backlight assembly and a display apparatus having the backlight assembly. More particularly, the present invention relates to a backlight assembly with a reduced thickness thereof and a display apparatus having the backlight assembly.

2. Description of the Related Art

A liquid crystal display (LCD) apparatus is a type of flat display apparatus displaying an image using light transmissivity of liquid crystal. The LCD is typically lighter and thinner than other display types, requires a lower driving voltage, and has a lower power consumption. Thus the LCD is widely used.

Since an LCD panel for displaying an image is not capable of emitting light by itself, the LCD needs an additional backlight assembly for providing the light to the LCD panel.

Conventionally, a cold cathode fluorescent lamp (CCFL) is mainly used as a light source in the backlight assembly. However, more recently, the backlight assembly includes a light-emitting diode (LED) having better color reproducibility and lower power consumption than that of the CCFL.

When the LED is used as the point light source in a large-sized product such as a TV, a monitor and so on, a plurality of LEDs is disposed under the LCD panel and provides light to the LCD panel. The LEDs emit light upward to the LCD panel that is disposed over the LEDs. The LEDs are point light sources. Accordingly, in order have a uniform luminance of light generated by the LEDs, a diffusion plate is disposed between the LEDs and the LCD panel.

However, in order to have a uniform luminance of light, a sufficient distance between the LEDs and the diffusion plate should be maintained. Thus, there are limitations in reducing a display apparatus product's thickness.

SUMMARY OF THE INVENTION

The present invention provides a backlight assembly capable of reducing a product's thickness.

The present invention also provides a display apparatus having the backlight assembly.

In an example backlight assembly according to the present invention, the backlight assembly includes a receiving container, a diffusion plate, a light source unit, and a reflective element. The receiving container has a bottom plate and a side wall defining a receiving space. The diffusion plate is disposed over the receiving space. The light source unit is disposed in the receiving space, and the light source unit includes at least one point light source. The at least one point light source is oriented to emit light mainly in a direction parallel to a plane of the diffusion plate. The reflective element has a reflective surface which forms a predetermined angle greater than 0 degree with respect to the bottom plate and is oriented to reflect the light from the point light source. The reflective surface is separated from the point light source by a predetermined distance.

The light source unit further includes a circuit board, on which a plurality of point light sources are mounted, and which is disposed on the bottom plate of the receiving container. The point light source comprises a light-emitting diode (LED).

The point light source may include a light-emitting diode (LED) chip, a heat dissipating part for dissipating heat generated from the LED chip, a housing adhering to the circuit board for receiving the LED chip and the heat dissipating part, and a heat blocking layer formed in an area that excludes the area adjacent to and facing the circuit board between the heat dissipating part and the housing, for blocking heat conduction.

The reflective element is disposed on the circuit board and along rear surfaces of the point light sources. The reflective surface is angled, such that an upper portion of the reflective surface is closer to the point light source than a lower portion of the reflective surface. The reflective surface includes a lower reflective surface, for reflecting a lower light beam to a first area of the diffusion plate, and an upper reflective surface, for reflecting an upper light beam to a second area of the diffusion plate. For example, the lower reflective surface may include a concave curved surface, and the upper reflective surface may include a convex curved surface.

The light source unit includes at least three point light sources arranged in a triangular configuration, and the reflective element includes a triangular structure, each portion thereof having at least one associated point light source.

Alternatively, the light source unit includes at least four point light sources arranged in rectangular configuration, and the reflective element includes a regular square structure, each portion thereof having at least one associated point light source.

In addition, the light source unit includes at least six point light source arranged in a hexagonal configuration, and the reflective element includes six portions arranged in a hexagonal structure, each portion having at least one associated point light source.

In an example display apparatus according to the present invention, the display apparatus includes a backlight assembly for providing light and a display panel disposed over the backlight assembly, for displaying an image using the light provided from the backlight assembly. The backlight assembly includes a receiving container having a bottom plate and a side wall defining a receiving space, a diffusion plate disposed over the receiving space, a light source unit disposed in the receiving space, the light source unit including at least one point light source, wherein the point light source is oriented to emit light mainly in a direction parallel to a plane of the at least one diffusion plate, and a reflective element having a reflective surface which forms a predetermined angle greater than 0 degree with respect to the bottom plate and is oriented to reflect the light from the point light source toward the diffusion plate, the reflective surface being separated from the point light source by a predetermined distance. According to the present invention, brightness uniformity is improved, and the display apparatus product's thickness may be reduced.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
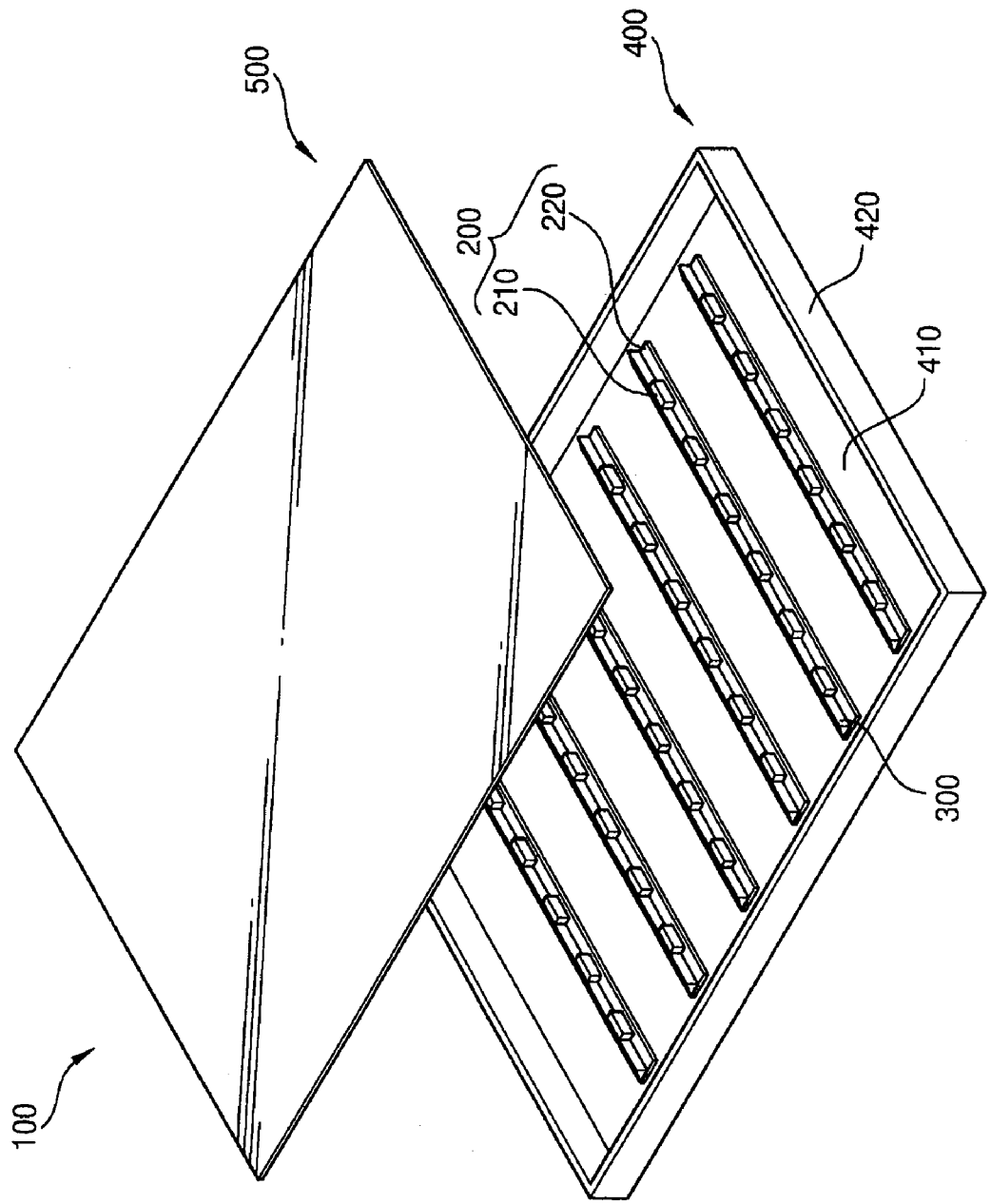
FIG. 1 is an exploded perspective view illustrating a backlight assembly according to an example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
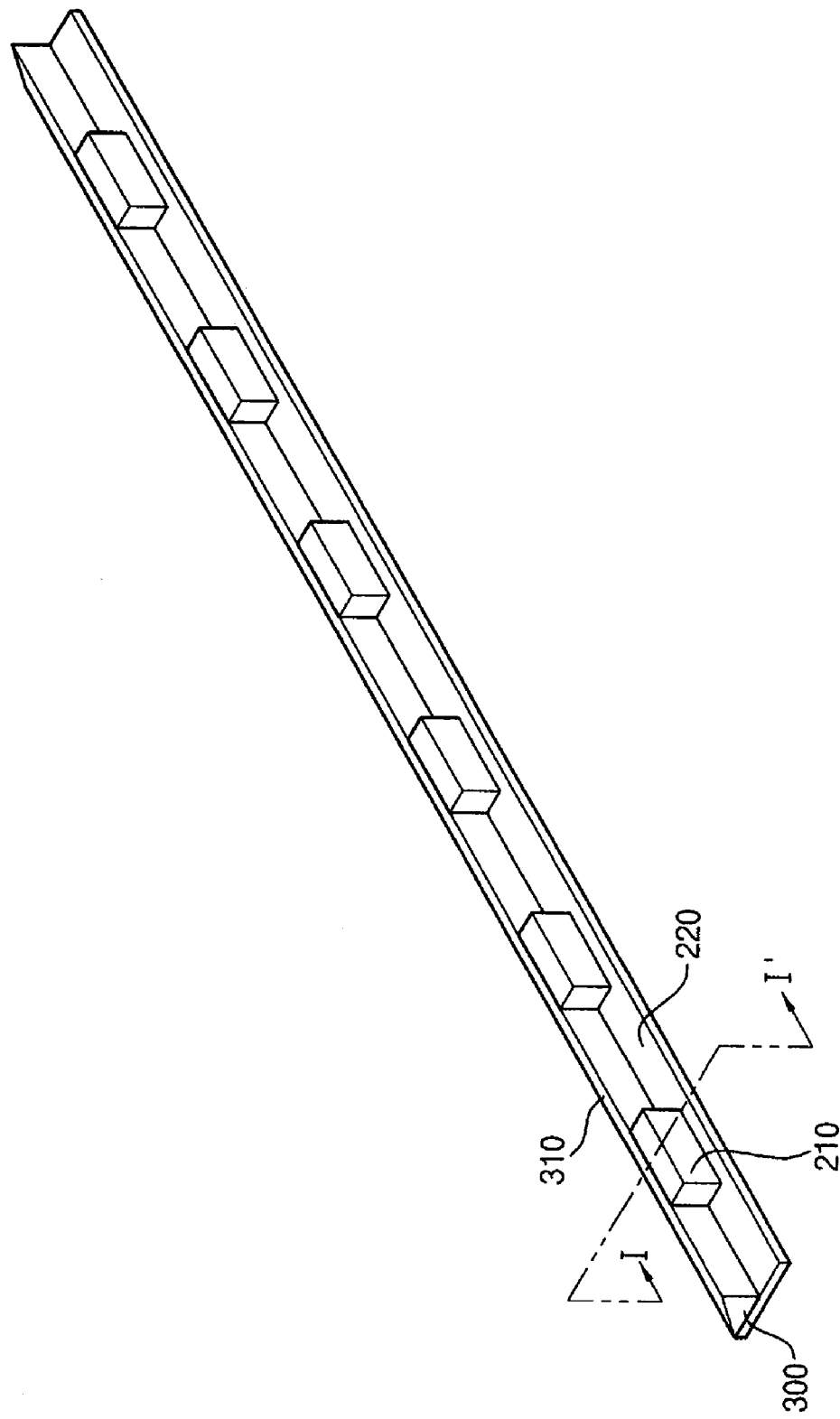
FIG. 2 is a perspective view illustrating a light source unit and a reflective element of FIG. 1.

FIG. 1 is an exploded perspective view illustrating a backlight assembly according to an example embodiment of the present invention. FIG. 2 is a perspective view illustrating a light source unit and a reflective element in FIG. 1.

Referring to FIGS. 1 and 2, the backlight assembly 100 according to the present example embodiment includes a light source unit 200, a reflective element 300, a receiving container 400 and a diffusion plate 500.

The light source unit 200 includes at least one point light source 210 emitting light and a circuit board 220 on which the point light sources 210 are mounted. The point light sources 210 are mounted on the circuit board 220 in a line, and emit the light to a side direction in response to a driving power applied from an external apparatus through the circuit board 220.

The reflective elements 300 are separated from each other by a constant distance from a light-exiting surface of the point light source 210 to the side direction. The reflective element 300 includes a reflective surface 310 for reflecting the light emitted from the point light source 210 of an adjacent light source unit 200 toward the diffusion plate 500 disposed over the light source unit 200.

The receiving container 400 includes a bottom plate 410 and a side wall 420, for receiving the light source unit 200 and the reflective element 300. The side wall 420 is upwardly extended from a side of the bottom plate 410 and defines a receiving space. For example, the receiving container may include metals having high strength and low flexibility.

The diffusion plate 500 is disposed over the light source unit 200 and the reflective element 300. The diffusion plate 500 diffuses the light emitted from the light source unit 200 and reflected by the reflective element 300, resulting in enhanced brightness uniformity. The diffusion plate 500 includes a transparent material for transmitting the light, and may include a diffusion material for enhancing the diffusion of the light. For example, the diffusion plate 500 may include polymethyl methacrylate (PMMA).

Although not shown in the figure, various optical sheets such as a diffusion sheet, a prism sheet, a reflection polarized sheet and so on may be disposed over the diffusion plate 500.

Figure 3:
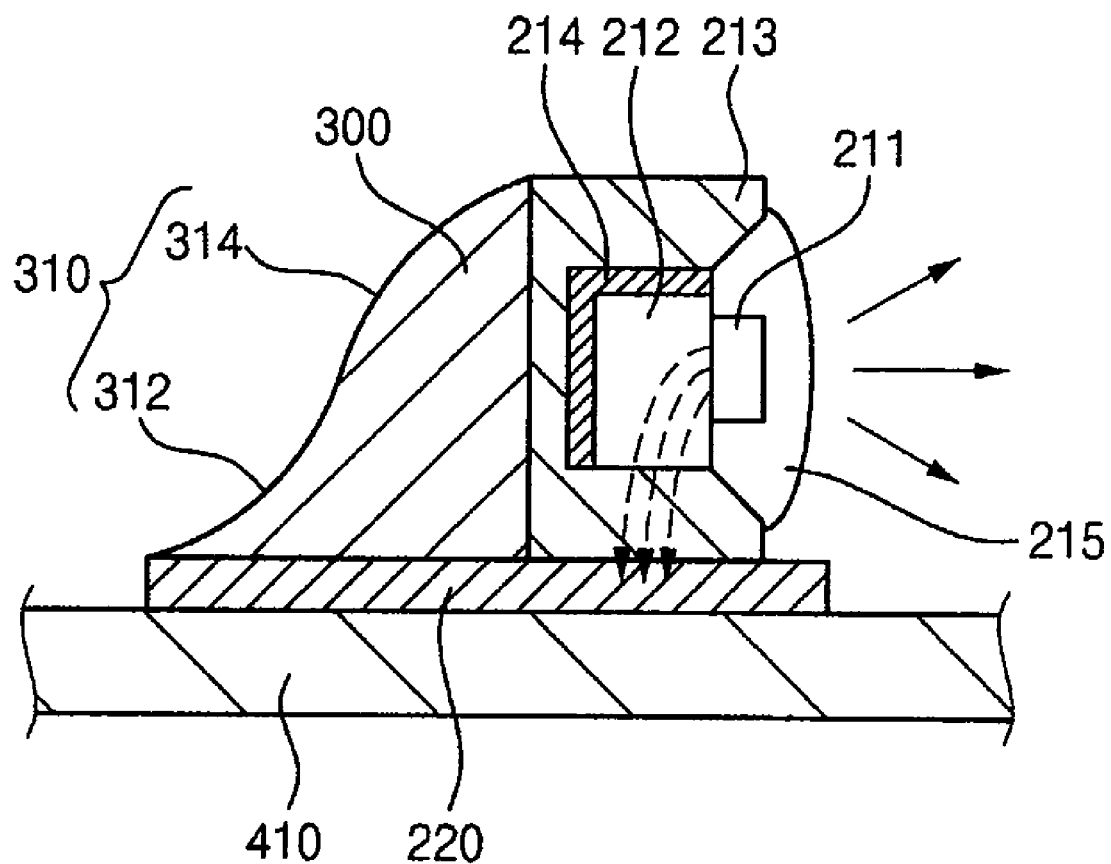
FIG. 3 is a cross-sectional view taken along a line I-I' of FIG. 2.

FIG. 3 is a cross-sectional view taken along a line I-I' in FIG. 2 and for further explanation includes a portion of bottom plate 410.

Referring to FIG. 3, the point light source 210 is mounted on the circuit board 220, for emitting the light to the side direction. The point light source 210 may include a light-emitting diode (LED) chip 211, a heat dissipating part 212, a housing 213, a heat blocking layer 214, and a protective layer 215.

The LED chip 211 is disposed in the housing 213, for emitting the light. For example, the LED chip 211 may include a blue chip emitting blue light. When the LED chip 211 includes the blue chip, the protective layer 215 may include a yellow fluorescent material converting the blue light into white light. Alternatively, the LED chip 211 may include a red chip emitting red light, a green chip emitting green light and a blue chip emitting blue light. When the LED chip 211 includes the red, green and blue chips, the red light, the green light and the blue light may be mixed to create white light.

The heat dissipating part 212 is disposed at a rear surface of the LED chip 211, which is opposite to the light-exiting surface. The heat dissipating part 212 dissipates heat generated from the LED chip 211 to the exterior of the point light source 210. The heat dissipating part 212 includes materials having a low heat resistance, for enhancing efficiency of heat dissipation.

The housing 213 receives the LED chip 211 and the heat dissipating part 212, and forms a body of the point light source 210. For example, the housing 213 may include a ceramic material. The housing 213 is adhered to the circuit board 220, such that the light-exiting surface of the LED chip 211 faces a side surface.

The heat blocking layer 214 is disposed between the heat dissipating part 212 and the housing 213, for blocking heat generated from the LED chip 211. The heat blocking layer 214 includes materials having a higher heat resistance than that of the heat dissipating part 212, for blocking the heat conduction.

The heat blocking layer 214 is formed in an area that excludes the area adjacent to and facing the circuit board 220, for emitting the heat generated from the LED chip 211 to a lower direction in which the receiving container 400 is disposed. Thus, the heat generated from the LED chip 211 may be transmitted to the exterior of the point light source 210 by passage through the heat dissipating part 212, the housing 213, the circuit board 220 and the receiving container 400.

The protective layer 215 fills the inside of the housing 213, and covers LED chip 211 and the heat dissipating part 212. The protective layer 215 may cover the LED chip 211 to protect the LED chip 211, and may diffuse the light exiting from the LED chip 211. For example, the protective layer 215 may include a diffused epoxy resin.

The circuit board 220, on which the point light sources are mounted in a line, is disposed on the bottom plate 410 of the receiving container 400 by a constant distance, as illustrated in FIG. 1. The circuit board 220 may include a power line (not shown) for applying the driving power from the external apparatus to the point light sources 210. The circuit board 220, for example, may include a printed circuit board (PCB) or a metal-core printed circuit board (MCPCB). Preferably, the circuit board 220 includes the MCPCB, for improving the efficiency of the heat dissipation.

Referring to FIGS. 1 and 2, the reflective element 300 is separated from the point light sources 210 by a constant distance, for reflecting the light generated from the point light sources 210. Preferably, the reflective element 300 is disposed on rear surfaces of the point light sources 210. The point light sources 210 are disposed in a line and are separated from the point light sources 210 disposed on one of the circuit board 220 in a line.

Referring to FIG. 3, the reflective surface 310 of the reflective element 300 that reflects the light from the point light sources 210 upward is angled, such that an upper portion of the reflective surface is closer to the point light source than a lower portion of the reflective surface.

Figure 4:
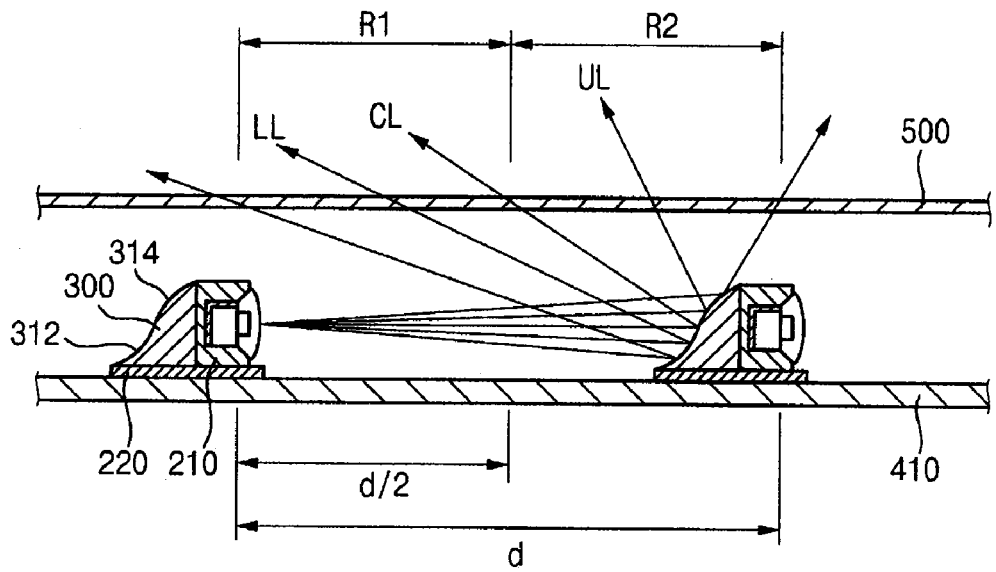
FIG. 4 is a conceptual view explaining a reflective function of the reflective element of FIG. 3.

FIG. 4 is a conceptual view illustrating the reflective function of the reflective element 300 in FIG. 3.

Referring to FIGS. 3 and 4, the light source units 200 are disposed on the bottom plate 410 of the receiving container 400 such that the light source units 200 are separated from each other by a distance 'd'. The reflective element 300 is disposed on the rear surfaces of the point light sources 210.

The reflective surface 310 of the reflective element 300 includes a lower reflective surface 312 and an upper reflective surface 314, for uniformly reflecting the light incident from the point light source 210 toward the diffusion plate 500 that is disposed over the receiving container 400. For example, the reflective surface 310 forms a predetermined angle greater than about 0 degree with respect to the bottom plate 410.

In the light advancing to the side direction from the point light source 210, central light beam CL exits substantially parallel with the bottom plate 410 of the receiving container 400. The central light beam CL is reflected at a region of the reflective element 300 where the lower and upper reflective surfaces 312 and 314 meet each other, to reach a position where areas R1 and R2 meet each other of the diffusion plate 500, which corresponds to a central portion of the distance 'd' of bottom plate 410.

In the light emitted from the point light source 210, a lower light beam LL beneath the central light beam CL is reflected by the lower reflective surface 312 to reach a first area R1 of the diffusion plate 500, which corresponds to an area between the positions 0 to d/2 of bottom plate 410.

In the light exiting from the point light source 210, an upper light beam UL above the central light beam CL is reflected by the upper reflective surface 314 to reach a second area R2 of the diffusion plate 500, which corresponds to an area between the positions d/2 to d of the bottom plate 410.

The lower reflective surface 312 may be formed to have a concave curved surface, for reflecting the lower light beam LL incident from the point light source 210 to the first area R1 of the diffusion plate 500. The upper reflective surface 314 may be formed to have a convex curved surface, for reflecting the upper light beam UL incident from the point light source 210 to the second area R2 of the diffusion plate 500.

The lower and upper reflective surfaces 312 and 314 may have various geometric shapes, as long as the lower light beam LL is reflected to the first area R1 of the diffusion plate 500 and the upper light beam UL is reflected to the second area R2 of the diffusion plate 500. Alternatively, the lower reflective surface 312 may be formed to reflect the lower light beam LL toward the second area R2 of the diffusion plate 500, and the upper reflective surface 314 may be formed to reflect the upper light beam UL toward the first area R1 of the diffusion plate 500.

Thus, the light exiting to the side direction from the point light sources 210 is uniformly reflected to the diffusion plate 500 through the lower and upper reflective surfaces 312 and 314 of the reflective element 300, so that the uniform brightness may be maintained and the distance between the point light sources 210 and the diffusion plate 500 may be reduced. In addition, the distance between the light source units 200 is increased by using the point light sources 210 having better straightness, so that the number of the point light sources 210 may be reduced, resulting in lower manufacturing costs.

Figure 5:
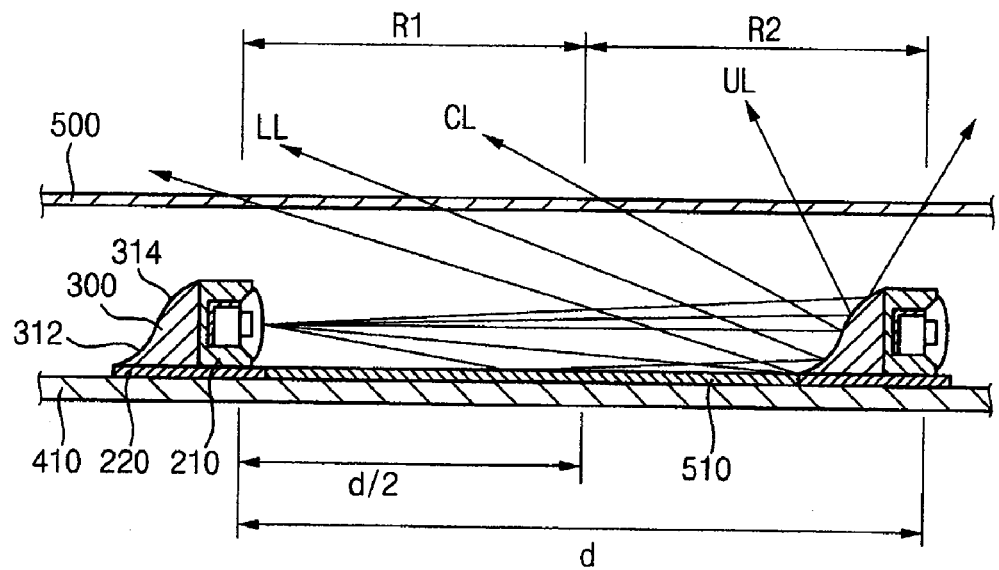
FIG. 5 is a cross-sectional view illustrating a backlight assembly according to another example embodiment of the present invention.

FIG. 5 is a cross-sectional view illustrating a backlight assembly according to another embodiment of the present invention.

Referring to FIG. 5, when the distance between the light source units 200 increases, the lower light beam LL partially advances to the bottom plate 410 of the receiving container 400, resulting in a loss of the light. Thus, the backlight assembly 100 may further include a reflective sheet 510 that is disposed on the bottom plate 410 of the receiving container 400 between the light source units 210. The reflective sheet 510 reflects the lower light beam LL advancing to the bottom plate 410, so that the loss of the light is prevented.

Some of the lower light beam LL exiting from the point light source 210 is directly reflected on the lower reflective surface 312, so that reaches the first area R1 of the diffusion plate 500. Some of the lower light beam LL exiting from the point light source 210 is first reflected from the reflective sheet 510 and then reflected on the lower reflective surface 312, so that reaches the first area R1 of the diffusion plate 500.

The upper light beam UL exiting from the point light source 210 is directly reflected on the upper reflective surface 314 to reach the second area R2 of the diffusion plate 500.

The reflective sheet 510 is disposed between the light source units 200, so that the distance between the light source units 200 is increased. Thus, a uniform brightness may be maintained without the loss of the light and the manufacturing costs may be more reduced by reducing the number of the point light sources 210.

Figure 6:
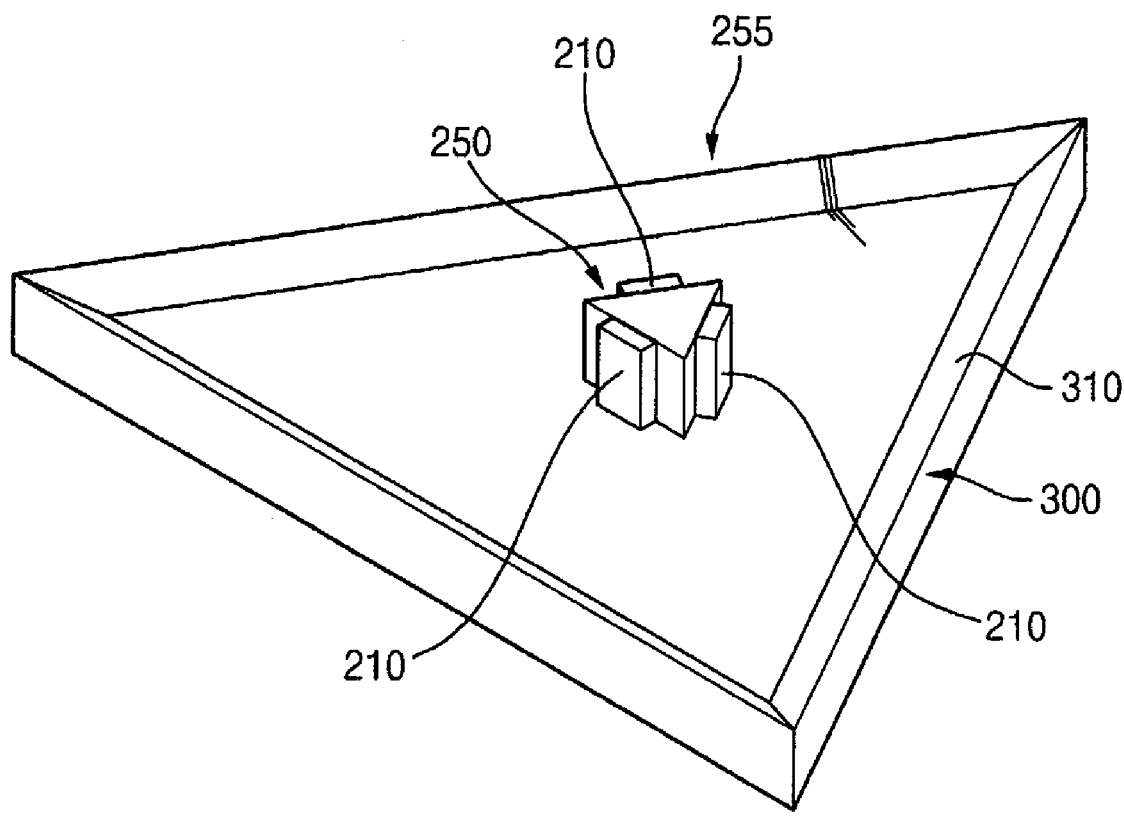
FIG. 6 is a perspective view illustrating a backlight assembly according to still another example embodiment of the present invention.
Figure 7:
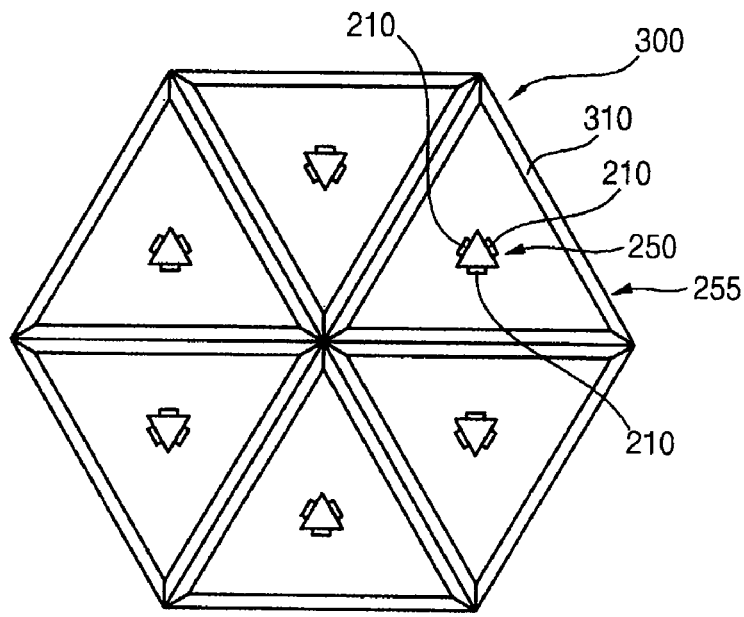
FIG. 7 is a plan view illustrating an arrangement of the light source unit and the reflective element in FIG. 6.

FIG. 6 is a perspective view illustrating light source unit along with an associated reflective element for use in a backlight assembly according to still another example embodiment of the present invention. Other elements of the backlight assembly may be as illustrated and explained above. FIG. 7 is a plan view illustrating an arrangement of the light source unit and the reflective element in FIG. 6.

Referring to FIGS. 6 and 7, the light source unit 250 includes three point light sources 210 disposed to have a regular triangular structure. The reflective element 300 is separated from the light source unit 250 by a predetermined distance and is disposed to have a regular triangular structure, to correspond to each point light source 210. The point source unit 250 is disposed at a central portion of the reflective element 300 having a regular triangular structure, for each point light source 210 to face the reflective surface 310 of the reflective element 300.

The light source unit 250 having three point light sources 210 disposed to have a regular triangular structure, and the reflective element 300 having a regular triangular structure having the point light source unit 250 disposed at the central portion thereof, define a light source cluster 255.

As illustrated in FIG. 7, light source clusters 255, each having a regular triangular structure, are disposed to have a regular hexagon structure, for enhancing brightness uniformity. The light source clusters 255 having a regular hexagon structure are compact, so that the uniform brightness may be obtained over an entire area. In addition, the brightness of a local position may be controlled by controlling a light-emitting of the light source clusters 255 separately, so that contrast ratio may be enhanced.

As explained above, the light exiting from the point light source 210 to the side direction is uniformly reflected to the upper direction using the reflective element 300, referring to FIG. 4. Thus, a more detailed description is not required.

Figure 8:
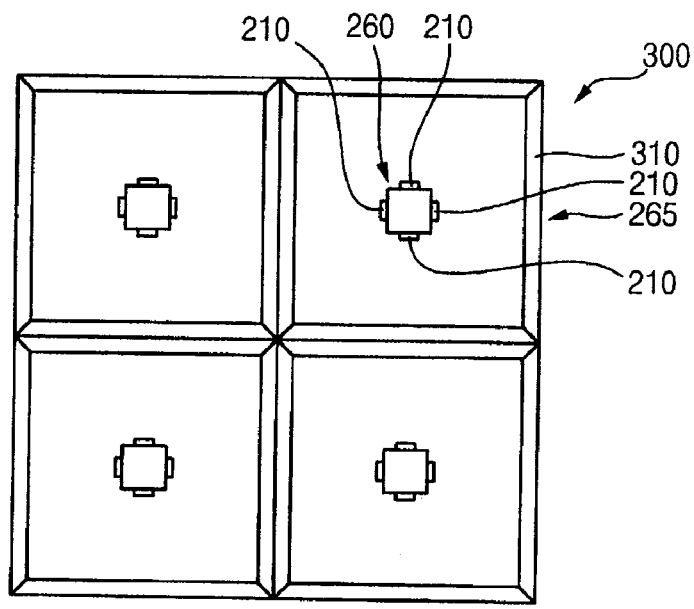
FIG. 8 is a plan view illustrating another arrangement of the light source unit and the reflective element.

FIG. 8 is a plan view illustrating another arrangement of the light source unit and the reflective element.

Referring to FIG. 8, the light source unit 260 is comprised of four point light sources 210 disposed in a rectangular configuration, and more specifically in this embodiment a square configuration. The reflective element 300 is separated from the point light source 210 by a predetermined distance and is disposed to have a regular square structure, to correspond to each point light source 210. The light source unit 260 is disposed at a central portion of the reflective element 300 having a regular square structure, for each point light source 210 to face the reflective surface 310 of the reflective element 300.

The light source unit 260 having four point light sources 210 disposed to have a regular square structure, and the reflective element 300 having a regular square structure to dispose the light source unit 260 at the central portion, become one light source cluster 265. The light source clusters 265 having a regular square structure are compact, so that the uniform brightness may be obtained over an entire area. In addition, the brightness of a local position may be controlled by controlling a light emission of the light source clusters 265 separately, so that the contrast ratio may be enhanced.

Figure 9:
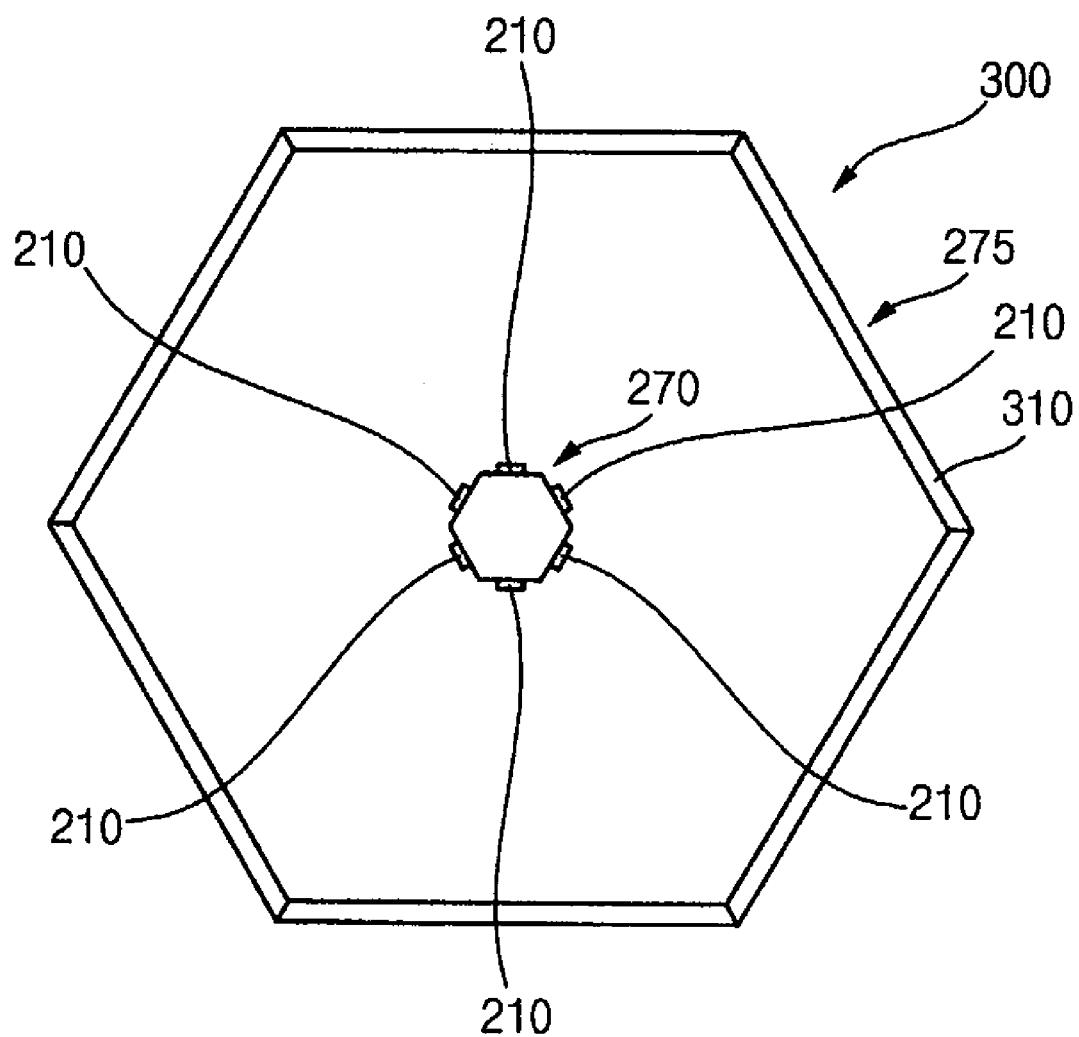
FIG. 9 is a plan view illustrating still another arrangement of the light source unit and the reflective element.

FIG. 9 is a plan view illustrating still another arrangement of the light source unit and the reflective element.

Referring to FIG. 9, the light source unit 270 includes six point light sources 210 disposed to have a regular hexagon structure. The reflective element 300 is separated from the point light source 210 by a predetermined distance and is disposed to have a regular hexagon structure, to correspond to each point light source 210. The light source unit 270 is disposed at a central portion of the reflective element 300 having the regular hexagon structure, for each point light source 210 to face the reflective surface 310 of the reflective element 300.

The light source unit 270 having six point light sources 210 disposed to have a regular hexagon structure, and the reflective element 300 having a regular hexagon structure to dispose the light source unit 270 at the central portion, define a light source cluster 275. The light source clusters 275 having a regular hexagon structure are compact, so that the uniform brightness may be obtained over an entire area. In addition, the brightness of a local position may be controlled by controlling a light emission of the light source clusters 275 separately, so that the contrast ratio may be enhanced.

Figure 10:
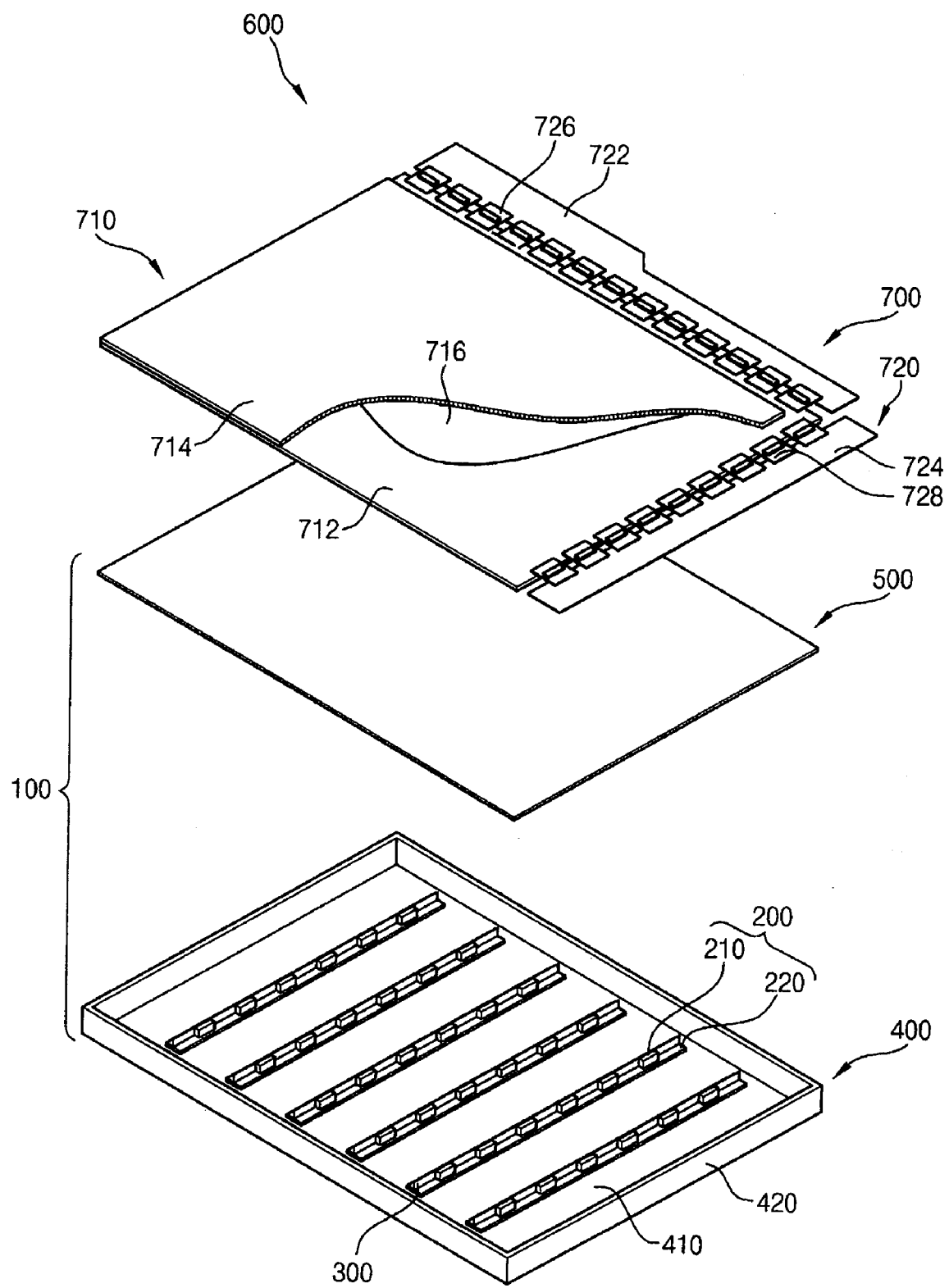
FIG. 10 is an exploded perspective view illustrating a display apparatus according to an example embodiment of the present invention.

FIG. 10 is an exploded perspective view illustrating a display apparatus according to an example embodiment of the present invention.

Referring to FIG. 10, the display apparatus 600 includes a backlight assembly 100 for providing light, and a display unit 700 for displaying an image by using the light provided from the backlight assembly 100.

The backlight assembly 100 may include various example embodiments as illustrated in FIGS. 1 to 9. Thus, more detailed descriptions will be omitted.

The display unit 700 includes a display panel 710 and a driving circuit part 720. The display panel 710 is disposed over the backlight assembly 100 and displays images by using the light provided from the backlight assembly 100. The driving circuit part 720 drives the display panel 710.

The display panel 710 may include a first substrate 712, a second substrate 714 combined with the first substrate 712, and the liquid crystal layer 716 disposed between the first and second substrates 712 and 714.

The first substrate 712, for example, may be a thin-film transistor (TFT) substrate, and the TFT substrate includes TFTs that are switching elements and are arranged in a matrix shape. A source terminal and a gate terminal of one the TFTs are electrically connected to one of data lines and one of gate lines, respectively. A drain terminal of one of the TFTs is electrically connected to a pixel electrode that includes a transparent conductive material.

The second substrate 714, for example, may be a color filter substrate, and the color filter substrate includes red-green-blue (RGB) color filters that are formed in a thin-film shape for displaying a color image. A common electrode is formed on the second substrate 714. The color filter substrate may be formed on the first substrate 712.

The driving circuit part 720 includes a data PCB 722 providing a data driving signal to the display panel 710, a gate PCB 724 providing a gate driving signal to the display panel 710, a data driving circuit film 726 connecting the data PCB 722 to the display panel 710, and a gate driving circuit film 728 connecting the gate PCB 724 to the display panel 710.

The data driving circuit film 726 and the gate driving circuit film 728 include a tape carrier package (TCP) or a chip-on-film (COF) on which a data driving chip and a gate driving chip are respectively mounted. The gate PCB 724 may be eliminated by forming an additional signal line on the display panel 710 and the gate driving circuit film 728.

When the gate driving signal is applied to the gate terminal of the TFT to turn on the TFT, the data driving signal is applied to the pixel electrode and an electric field is generated between the pixel electrode and the common electrode. A longitudinal arrangement direction of liquid crystal molecules in the liquid crystal layer 716 disposed between the first and second substrates 712 and 714 is changed by the electric field. The transmissivity of the light provided from the backlight assembly is changed according to the longitudinal arrangement direction of the liquid crystal molecules, so that the image having a predetermined gray scale may be displayed.

According to the present invention, the light exiting from the point light sources 210 to the side direction is uniformly reflected to the diffusion plate 500 through the reflective element 300, so that the uniform brightness may be maintained and a product's thickness may be reduced by reducing the distance between the point light sources and the diffusion plate.

In addition, the distance between light source units is increased, so that the number of the point light sources is reduced. Thus, the manufacturing cost may be reduced.

Having described the example embodiments of the present invention and its advantage, it is noted that various changes, substitutions and alterations can be made herein without departing from the spirit and scope of the invention as defined by appended claims.

What is claimed is:

1. A backlight assembly comprising:
   a receiving container having a bottom plate and a side wall defining a receiving space;
   a diffusion plate disposed over the receiving space;
   a light source unit disposed in the receiving space, the light source unit including at least one point light source, wherein the at least one point light source is oriented to emit light mainly in a direction parallel to a plane of the diffusion plate; and
   a reflective element having a reflective surface which forms a predetermined angle greater than 0 degree with respect to the bottom plate and is oriented to reflect the light from the point light source toward the diffusion plate, the reflective surface being separated from the point light source by a predetermined distance,
   wherein the light source unit further includes:
      a heat dissipating part dissipating heat generated from the point light source; and
      a heat blocking layer connected to the heat dissipating part, and formed in an area that excludes a portion facing the bottom plate of the receiving container to block heat conduction.

2. The backlight assembly of claim 1, wherein the light source unit further includes a circuit board on which a plurality of point light sources are mounted and which is disposed on the bottom plate of the receiving container.

3. The backlight assembly of claim 1, wherein the point light source comprises a light-emitting diode (LED).

4. The backlight assembly of claim 1, wherein the light source unit further includes:
   a light-emitting diode (LED) chip; and
   a housing receiving the LED chip and adhering to the heat dissipating part.

5. The backlight assembly of claim 4, wherein the LED chip comprises a red chip emitting red light, a green chip emitting green light and a blue chip emitting blue light.

6. The backlight assembly of claim 1, wherein the reflective element is disposed and along a rear surface of the point light source.

7. A backlight assembly comprising:
   a receiving container having a bottom plate and a side wall defining a receiving space;
   a diffusion plate disposed over the receiving space;
   a light source unit disposed in the receiving space, the light source unit including at least one point light source, wherein the at least one point light source is oriented to emit light mainly in a direction parallel to a plane of the diffusion plate; and
   a reflective element having a reflective surface which forms a predetermined angle greater than 0 degree with respect to the bottom plate and is oriented to reflect the light from the point light source toward the diffusion plate, the reflective surface being separated from the point light source by a predetermined distance,
   wherein the reflective surface is angled such that an upper portion of the reflective surface is closer to the point light source than a lower portion of the reflective surface.

8. The backlight assembly of claim 7, wherein the reflective surface includes:
   a lower reflective surface to reflect a lower light beam to a first area of the diffusion plate; and
   an upper reflective surface reflecting upper light beam to a second area of the diffusion plate.

9. The backlight assembly of claim 8, wherein the lower reflective surface is a concave curved surface, and the upper reflective surface is a convex curved surface.

10. The backlight assembly of claim 1, wherein the backlight assembly comprises a plurality of light source units disposed on the bottom plate, and the backlight assembly further comprises a reflective sheet disposed on the bottom plate of the receiving container between the plurality of light source units.

11. The backlight assembly of claim 1, wherein the light source unit is comprised of at least three point light sources arranged in a triangular configuration, and the reflective element is comprised of a triangular structure each portion thereof having at least one associated point light source.

12. The backlight assembly of claim 1, wherein the light source unit is comprised of at least four point light sources arranged in rectangular configuration, and the reflective element is comprised of a regular square structure, each portion thereof having at least one associated point light source.

13. The backlight assembly of claim 1, wherein the light source unit is comprised of at least six point light sources arranged in a hexagonal configuration, and the reflective element is comprised of six portions arranged in a hexagonal structure, each portion having at least one associated point light source.

14. A display apparatus comprising:
a backlight assembly providing light; and
a display panel disposed over the backlight assembly to display an image using the light provided from the backlight assembly,
wherein the backlight assembly comprises;
a receiving container having a bottom plate and a side wall defining a receiving space;
a diffusion plate disposed over the receiving space;
a light source unit disposed in the receiving space, the light source unit including at least one point light source, wherein the point light source is oriented to emit light mainly in a direction parallel to a plane of the at least one diffusion plate; and
a reflective element having a reflective surface which forms a predetermined angle greater than 0 degree with respect to the bottom plate and is oriented to reflect the light from the point light source toward the diffusion plate, the reflective surface being separated from the point light source by a predetermined distances
wherein the light source unit further includes:
a heat dissipating part dissipating heat generated from the point light source; and
a heat blocking layer connected to the heat dissipating part, and formed in an area that excludes a portion facing the bottom plate of the receiving container to block heat conduction.

15. The display apparatus of claim 14, wherein the light source unit further includes a circuit board on which a plurality of point light sources are mounted and which is disposed on the bottom plate of the receiving container.

16. The display apparatus of claim 15, wherein the light source unit further includes:
a LED chip emitting the light; and
a housing receiving the LED chip and adhering to the heat dissipating part.

17. The display apparatus of claim 15, wherein the reflective element is disposed on rear surfaces of the point light sources that are disposed in a line, and
the reflective surface comprises:
a lower reflective surface to reflect a lower light beam to a first area of the diffusion plate; and
an upper reflective surface reflecting upper light beam to a second area of the diffusion plate.

18. The display apparatus of claim 14, wherein the light source unit is comprised of at least three point light sources arranged in a triangular configuration, and the reflective element is comprised of a triangular structure each portion thereof having at least one associated point light source.

19. The display apparatus of claim 14, wherein the light source unit includes a point light source group having the point light sources disposed to have a regular square structure, and the reflective element is disposed to have the regular square structure to correspond to each point light source.

20. The display apparatus of claim 14, wherein the light source unit includes a point light source group having the point light sources disposed to have a regular hexagonal structure, and the reflective element is disposed to have the regular hexagonal structure to correspond to each point light source.

21. A backlight assembly comprising:
a receiving container having a bottom plate and a side wall defining a receiving space;
a diffusion plate disposed over the receiving space;
a light source unit disposed in the receiving space, the light source unit including at least one point light source, wherein the at least one point light source is oriented to emit light mainly in a direction parallel to a plane of the diffusion plate; and
a reflective element having a reflective surface which forms a predetermined angle greater than 0 degree with respect to the bottom plate and is oriented to reflect the light from the point light source toward the diffusion plate,
wherein the reflective surface includes:
a lower reflective surface having a concave curved surface to reflect a lower light beam to a first area of the diffusion plate; and
an upper reflective surface having a convex curved surface to reflect an upper light beam to a second area of the diffusion plate.

* * * * *